(12) United States Patent
Roh et al.

(10) Patent No.: US 10,760,953 B2
(45) Date of Patent: Sep. 1, 2020

(54) IMAGE SENSOR HAVING BEAM SPLITTER

(71) Applicant: SAMSUNG ELECTRONICS CO., LTD., Suwon-si (KR)

(72) Inventors: Sookyoung Roh, Seoul (KR); Seokho Yun, Hwaseong-si (KR); Sunghyun Nam, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 207 days.

(21) Appl. No.: 15/805,318

(22) Filed: Nov. 7, 2017

(65) Prior Publication Data
US 2018/0164154 A1 Jun. 14, 2018

(30) Foreign Application Priority Data
Dec. 8, 2016 (KR) .................. 10-2016-0166882

(51) Int. Cl.
*H01L 27/14* (2006.01)
*G01J 1/04* (2006.01)
*G02B 27/10* (2006.01)
*G02B 5/20* (2006.01)
*H01L 27/146* (2006.01)
*H04N 9/04* (2006.01)

(52) U.S. Cl.
CPC .......... *G01J 1/0414* (2013.01); *G01J 1/0422* (2013.01); *G01J 1/0492* (2013.01); *G02B 5/201* (2013.01); *G02B 5/208* (2013.01); *G02B 27/1013* (2013.01); *H01L 27/14621* (2013.01); *H01L 27/14625* (2013.01); *H01L 27/14645* (2013.01); *H01L 27/14649* (2013.01); *H04N 9/04553* (2018.08); *H04N 9/04555* (2018.08)

(58) Field of Classification Search
CPC .. G01J 1/0414; G01J 1/0492; H04N 9/04553; H04N 9/04555; G02B 27/1013; H01L 27/14621; H01L 27/14645; H01L 27/14649
See application file for complete search history.

(56) References Cited

U.S. PATENT DOCUMENTS

| 8,258,560 | B1 | 9/2012 | Hynecek |
| 2010/0033611 | A1* | 2/2010 | Lee ................. H01L 27/14645 348/302 |
| 2010/0188537 | A1 | 7/2010 | Hiramoto et al. |
| 2010/0295947 | A1 | 11/2010 | Boulanger |

(Continued)

FOREIGN PATENT DOCUMENTS

| KR | 10-2014-0066637 A | 6/2014 |
| KR | 10-2016-0004641 A | 1/2016 |
| KR | 10-2016-0023158 A | 3/2016 |

*Primary Examiner* — Kevin K Pyo
(74) *Attorney, Agent, or Firm* — Sughrue Mion, PLLC

(57) ABSTRACT

An image sensor is provided. The image sensor may include; an optical detection device layer including a plurality of optical detection devices; a filter array layer including a plurality of color filters and at least one infrared filter, and disposed on the optical detection device layer; and a plurality of beam splitters disposed in a plurality of pixels, the plurality of pixels being in contact with an infrared ray pixel including the at least one infrared ray color filter, and that are configured to change a direction of an infrared ray component of incident light towards the infrared ray pixel.

11 Claims, 8 Drawing Sheets

(56) References Cited

U.S. PATENT DOCUMENTS

2015/0311239 A1\* 10/2015 Won ................ H01L 27/14621
                                                                  257/432
2016/0006995 A1    1/2016 Yun et al.
2016/0054173 A1\*  2/2016 Kim ................ H01L 27/14685
                                                                   250/208.1
2016/0260762 A1\*  9/2016 Ungnapatanin ... H01L 27/14621

\* cited by examiner

IMAGE SENSOR HAVING BEAM SPLITTER

CROSS-REFERENCE TO RELATED APPLICATION

This application claims priority from Korean Patent Application No. 10-2016-0166882, filed on Dec. 8, 2016 in the Korean Intellectual Property Office, the disclosure of which is incorporated herein by reference in its entirety.

BACKGROUND

1. Field

Apparatuses and methods consistent with exemplary embodiments relate to image sensors configured to increase light utilization efficiency by using beam splitters.

2. Description of the Related Art

Recently, various methods of obtaining a three-dimensional (3D) image for recognizing an object have been studied. Also, methods of simultaneously obtaining a visible light image and an infrared ray image by using a 3D depth extraction method have been studied. In order to increase conventional characteristics of an image in a visible light band or to meet the requisition of use, for example, an image sensor for vehicles, the need for obtaining an infrared ray image has increased to obtain a bright image in a dark place.

In order to simultaneously obtain an infrared ray image together with a visible light image, the infrared ray image may be obtained through modification of a pixel arrangement in an existing image sensor by using a pixel arrangement method, for example, one green pixel is replaced with an infrared ray pixel in a Bayer color filter arrangement or an additional infrared ray pixel is placed beside the Bayer color filter arrangement.

Generally, the number of pixels of an image sensor is gradually increased, and accordingly, the size of the pixel is gradually reduced. As a result, the amount of light reaching a single pixel is reduced. Accordingly, when the pixel arrangement of a conventional optical image sensor is simply modified, the sensitivity of an infrared ray image may be reduced.

SUMMARY

Exemplary embodiments address at least the above problems and/or disadvantages and other disadvantages not described above. Also, the exemplary embodiments are not required to overcome the disadvantages described above, and may not overcome any of the problems described above.

One or more exemplary embodiments provide image sensors having a structure configured to increase sensitivity of an infrared ray image by modifying the structure of the image sensor.

According to an aspect of an exemplary embodiment, there is provided an image sensor including: an optical detection device layer comprising a plurality of optical detection devices; a filter array layer comprising a plurality of color filters and at least one infrared filter, and disposed on the optical detection device layer; and a plurality of beam splitters that are disposed in a plurality of pixels, the plurality of pixels being in contact with an infrared ray pixel comprising the at least one infrared ray filter, and that are configured to change a direction of an infrared ray component of incident light towards the infrared ray pixel.

The plurality of pixels adjacent to the infrared ray pixel may be in contact with the infrared ray pixel in a horizontal direction and a vertical direction on a plain view of the image sensor.

The plurality of beam splitters may make the infrared ray component of the incident light that enters all of the plurality of pixels in contact with the infrared ray pixel travel towards the infrared ray pixel.

The plurality of pixels may be in contact with the infrared ray pixel in a diagonal direction of the infrared ray pixel on a plain view of the image sensor.

The plurality of pixels in contact with the infrared ray pixel in the diagonal direction may include the plurality of beam splitters that make the infrared ray component of the incident light that enters all of the plurality of pixels in contact with the infrared ray pixel travel towards the infrared ray pixel.

Each of the plurality of pixels may include at least one of the plurality of beam splitters.

The image sensor may further include a spacer layer disposed on the filter array layer, wherein the plurality of beam splitters may be disposed on the spacer layer.

The plurality of beam splitters may be buried in the spacer layer.

The infrared ray pixel may include at least one beam splitter that changes a travelling direction of light incident onto the infrared ray pixel.

The optical detection device layer may be disposed on a substrate, and the image sensor may further include barrier ribs that separate each of the plurality of optical detection devices.

The plurality of pixels may include a first pixel comprising a color filter and a second pixel comprising an infrared filter, wherein the first and second pixels are repeatedly arranged in a direction while being in contact with each other, and wherein the first pixel is an infrared ray pixel.

BRIEF DESCRIPTION OF THE DRAWINGS

The above and/or other aspects will be more apparent by describing certain exemplary embodiments, with reference to the accompanying drawings, in which.

DETAILED DESCRIPTION

Figure 1:
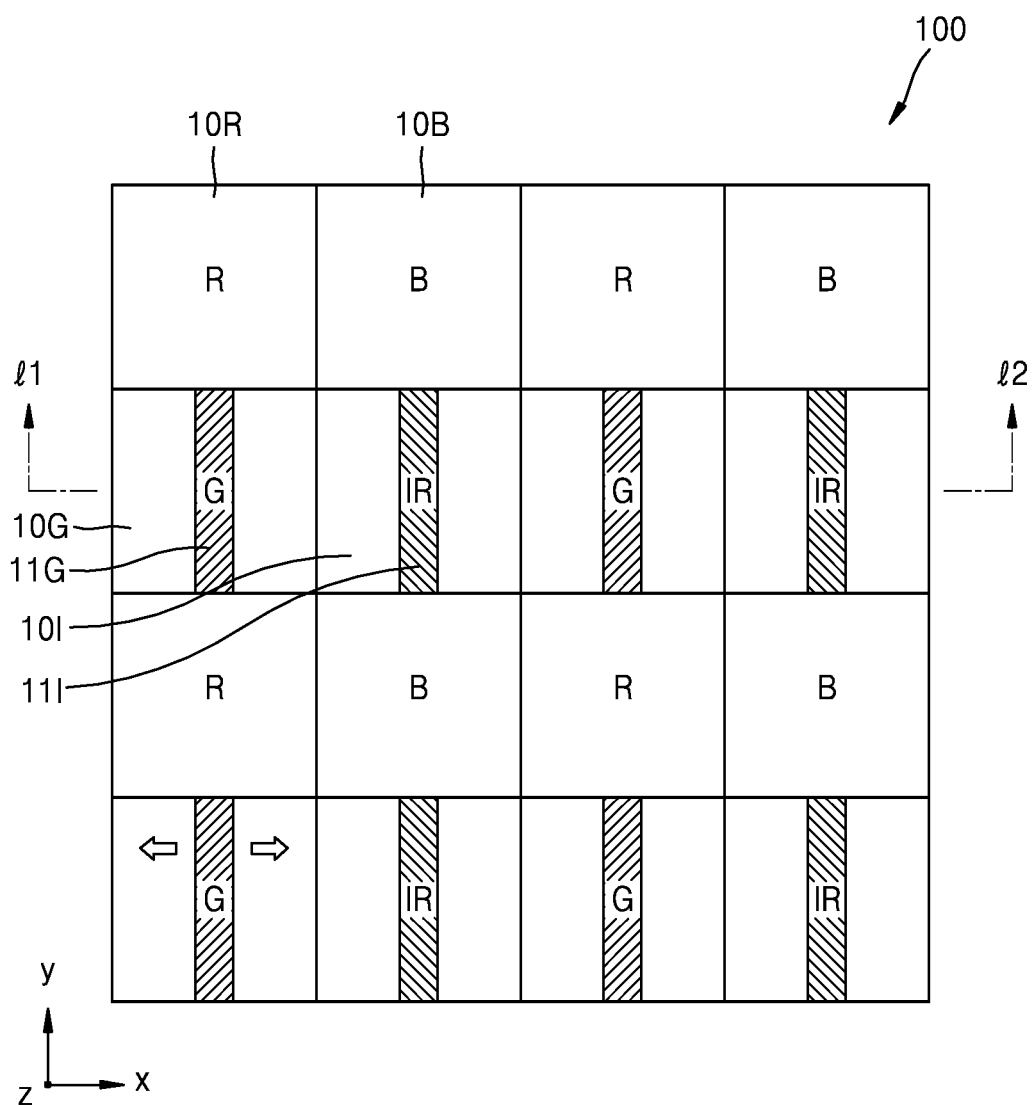
FIG. 1 is a schematic plan view of a pixel arrangement of an image sensor according to an exemplary embodiment.

Exemplary embodiments are described in greater detail below with reference to the accompanying drawings.

In the following description, like drawing reference numerals are used for like elements, even in different drawings. The matters defined in the description, such as detailed construction and elements, are provided to assist in a comprehensive understanding of the exemplary embodiments. However, it is apparent that the exemplary embodiments can be practiced without those specifically defined matters. Also, well-known functions or constructions are not described in detail since they would obscure the description with unnecessary detail.

Hereinafter, image sensors having beam splitters according to an exemplary embodiment will be described in detail with reference to the accompanying drawings. In the drawings, thicknesses and widths of layers and regions may be exaggerated or reduced for convenience of explanation. Also, like reference numerals refer to like elements throughout. In layer structures described below, when an element or layer is referred to as being "on" or "above" another element or layer, the element or layer may be directly on another element or layer or intervening elements or layers.

Figure 2:
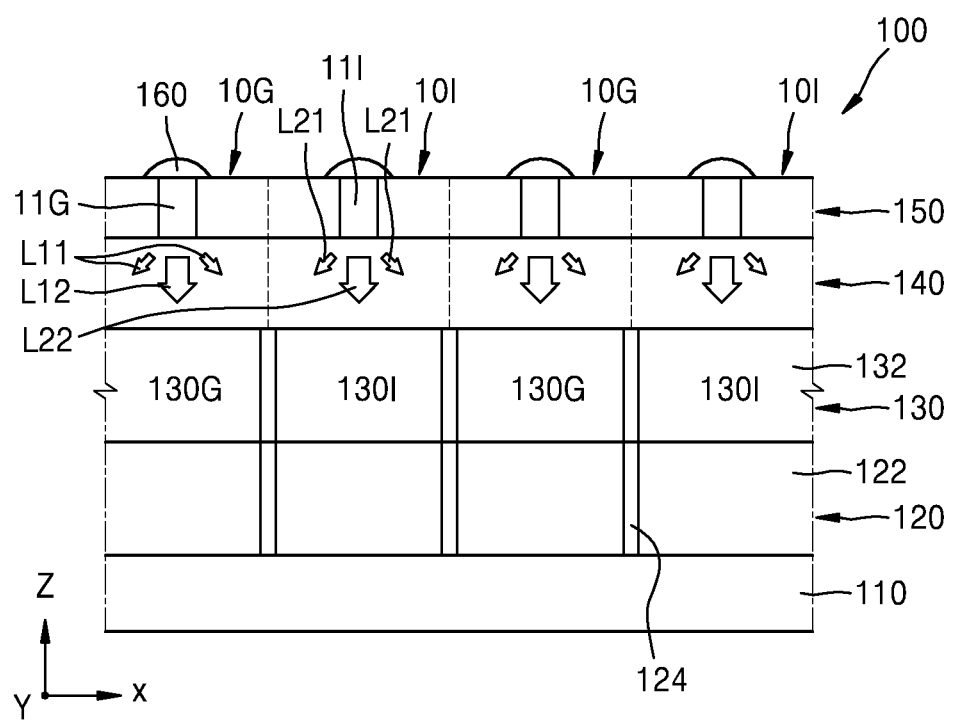
FIG. 2 is a cross-sectional view taken along line I1-I2 of the image sensor of FIG. 1.

FIG. 1 is a schematic plan view of a pixel arrangement of an image sensor 100 according to an exemplary embodiment. FIG. 2 is a cross-sectional view taken along line I1-I2 of the image sensor 100 of FIG. 1.

Referring to FIGS. 1 and 2, the image sensor 100 according to an exemplary embodiment may include an optical detection device layer 120 in which a plurality of optical detection devices 122 are arranged in a matrix form and a filter array layer 130 in which a plurality of filters (e.g., a plurality of color filters and a plurality of infrared filters) 132 respectively disposed on the optical detection devices 122 are arranged in a predetermined structure on a substrate 110. The plurality of filters 132 of the filter array layer 130 may transmit light of a specific wavelength. A transparent spacer layer 140 is disposed on the filter array layer 130, and a beam splitting layer 150 including beam splitters 11G and 11I is disposed on the transparent spacer layer 140. The beam splitters 11G and 11I may control the direction of light travelling into an inner side of the image sensor 100 according to the wavelength of the light incident to the image sensor 100. Also, the image sensor 100 may further include lenses 160 on the beam splitting layer 150 to focus light incident to the image sensor 100. Also, the image sensor 100 may further include barrier rib structures 124 to separate pixels on the substrate 110.

In the image sensor 100 according to the current exemplary embodiment, the plurality of filters 132 of the filter array layer 130 may be arranged in various shapes. Pixel unit regions in which each of the plurality of filters 132 of the filter array layer 130 is disposed are referred to as pixels 10G, 10I, 10R, and 10B. In FIGS. 1 and 2, it is seen an arrangement structure where second pixels each including a second filter 130I are disposed in a first direction (e.g., an I1-I2 direction or an x-direction of FIG. 1) of first pixels each including a first filter 130G, and the first and second pixels repeatedly contact each other. However, the current exemplary embodiment is not limited thereto, that is, the arrangement sequence of the plurality of filters 132 may be selectively determined. In particular, the first filter 130G may be a color filter (e.g., green color filter) and the second filter 130I may be an infrared filter.

In the image sensor 100 according to the current exemplary embodiment, the beam splitter 11G may be disposed in the pixel 10G adjacent to the infrared ray pixel 10I on a plain view of the image sensor 100. The beam splitter 11G may be disposed in the pixel 10G adjacent to the infrared ray pixel 10I, and the beam splitter 11G may change a travelling direction of light incident to the pixel 10G adjacent to the beam splitter 11G towards the infrared ray pixel 10I. The beam splitter 11G disposed in the pixel 10G on a side of the infrared ray pixel 10I may change the travelling direction of light passing through the beam splitter 11G by using a diffraction characteristic or a reflection characteristic according to a wavelength of light. Accordingly, the beam splitter 11G may transmit light L12 having a wavelength corresponding to a green wavelength band without changing a direction thereof. However, the beam splitter 11G may change the direction of light L11 having a wavelength in an infrared ray region or a near infrared ray region towards the infrared ray pixel 10I adjacent to the pixel 10G. Also, the beam splitter 11I may be disposed in the infrared ray pixel 10I. Among a plurality of components of light incident to the infrared ray pixel 10I, light L22 of an infrared ray component is transmitted without changing the direction thereof, and light L21 of wavelength regions besides the infrared ray region may be directed towards the pixel 10G adjacent to the infrared ray pixel 10I.

In the current exemplary embodiment, adjacent pixels to the infrared ray pixel 10I may include the pixel 10G (adjacent to the infrared ray pixel 10I in a horizontal direction, for example, an x direction), the pixel 10B (adjacent to the infrared ray pixel 10I in a vertical direction, for example, a y direction), and the pixel 10R (adjacent to the infrared ray pixel 10I in a diagonal direction).

The beam splitters 11G and 11I may have various shapes, for example, a bar shape or a prism shape, but the shapes thereof are not limited thereto. In FIG. 2, it is depicted that the beam splitting layer 150 and the transparent spacer layer 140 are separate layers. However, the beam splitting layer 150 and the transparent spacer layer 140 may be integrated into a single light transmitting layer, and the beam splitters 11G and 11I may be arranged in the transparent spacer layer 140. The beam splitters 11G and 11I may include a material having a refractive index that is greater than that of the transparent spacer layer 140. For example, the transparent spacer layer 140 and the beam splitting layer 150 may include silicon oxide $SiO_2$, and the beam splitters 11G and 11I may include $SiN_3$, $Si_3N_4$, or ZnS buried in the silicon oxide $SiO_2$.

An infrared ray component of light that directly enters the infrared ray pixel 10I or enters the infrared ray pixel 10I from surrounding pixels after a travelling direction thereof is changed by the beam splitter 11G is detected by the optical detection devices 122 of the optical detection device layer 120 after passing through infrared ray filters 130I of the filter array layer 130, and may generate an electrical signal corresponding to the intensity of the incident light. The optical detection devices 122 may be arranged in a two-dimensional matrix type on the substrate 110, and may be formed as a charge-coupled device (CCD) sensor or a complementary metal-oxide semiconductor (CMOS) sensor.

Figure 3:
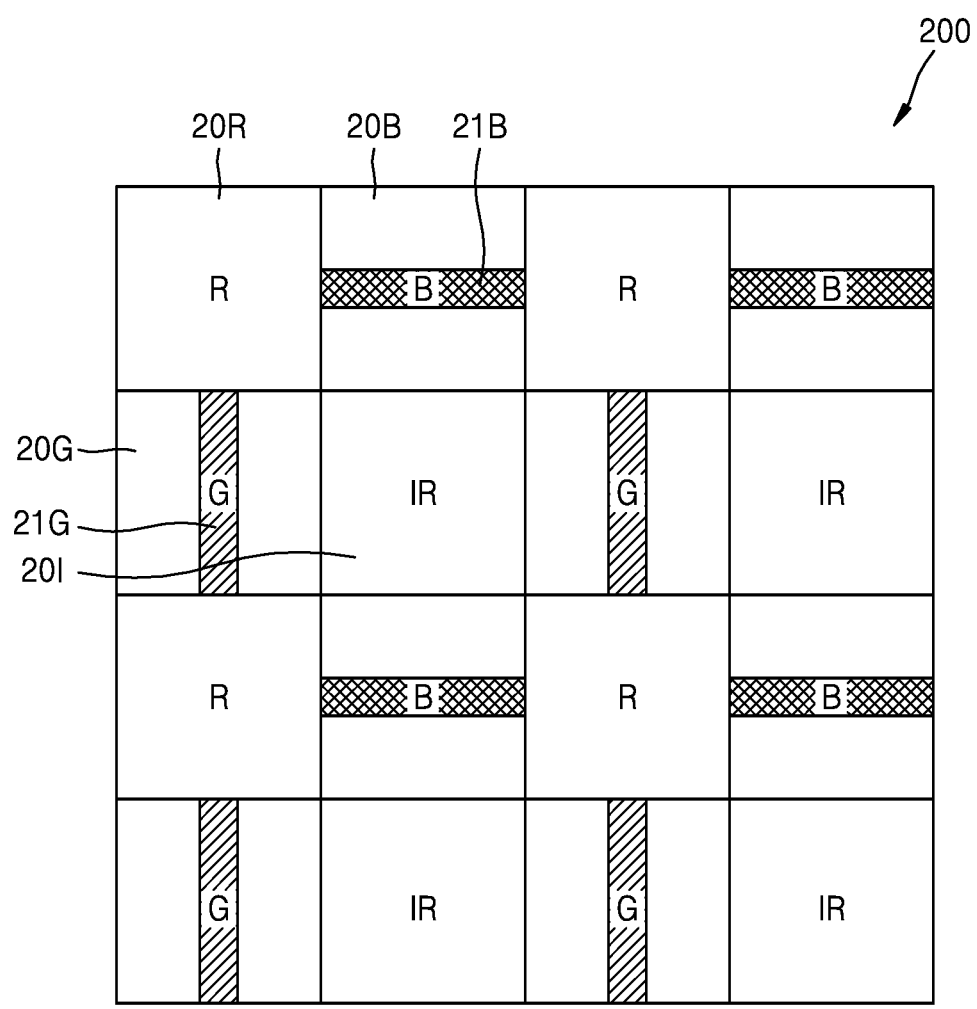
FIG. 3 is a schematic plan view of a pixel arrangement of an image sensor according to another exemplary embodiment.

FIG. 3 is a schematic plan view of a pixel arrangement of an image sensor 200 according to another exemplary embodiment.

Referring to FIG. 3, beam splitters 21B and 21G may be respectively disposed in pixel regions 20B and 20G adjacent to an infrared ray pixel 20I. Among a plurality of components of light incident to the pixel regions 20B and 20G adjacent to an infrared ray pixel 20I, the travelling direction of an infrared ray component is changed by the beam splitters 21B and 21G of the pixel regions 20B and 20G adjacent to the infrared ray pixel 20I, and thus, the intensity of an infrared ray of light incident to the infrared ray pixel 20I may be maximized. As a result of forming the beam splitters 21B and 21G that may refract all infrared ray components of light of the pixel regions 20B and 20G that are directly adjacent to the infrared ray pixel 20I towards the infrared ray pixel 20I, the optical efficiency of the infrared ray pixel 20I may be increased.

FIGS. 4A through 4E are plan views of various pixel arrangements of an image sensor according to an exemplary embodiment.

Figure 4A:
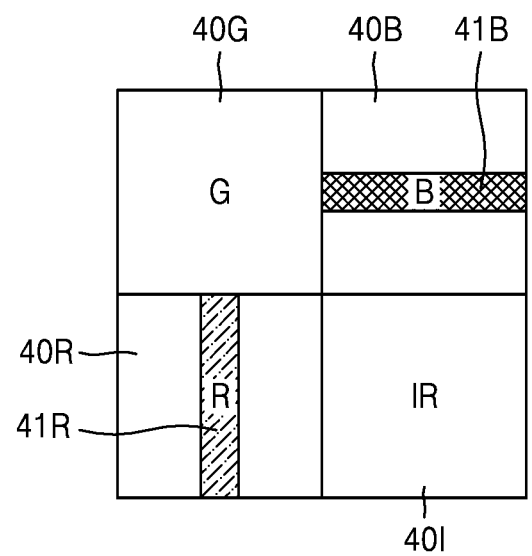
FIGS. 4A, 4B, 4C, 4D, and 4E are plan views of various pixel arrangements of an image sensor according to an exemplary embodiment.

Referring to FIG. 4A, an infrared ray pixel 40I is arranged to directly contact a blue pixel 40B and a red pixel 40R, and a green pixel 40G is disposed in a diagonal direction of the infrared ray pixel 40I on a plain view of the image sensor while being in contact with the blue pixel 40B and the red pixel 40R. Beam splitters 41B and 41R respectively are disposed in the blue pixel 40B and the red pixel 40R which are adjacent to the infrared ray pixel 40I, and thus, the optical efficiency of the infrared ray pixel 40I may be increased.

Figure 4B:
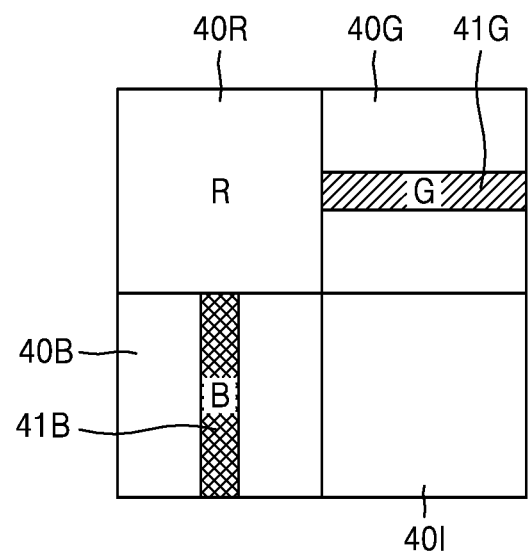

Referring to FIG. 4B, the infrared ray pixel 40I is arranged to directly contact the green pixel 40G and the blue pixel 40B, and the red pixel 40R is disposed in a diagonal direction of the infrared ray pixel 40I on a plain view of the image sensor while being in contact with the green pixel 40G and the blue pixel 40B. A beam splitter 41G and the beam splitter 41B respectively are disposed in the green pixel 40G and the blue pixel 40B which are adjacent to the infrared ray pixel 40I, and thus, the optical efficiency of the infrared ray pixel 40I may be increased.

Figure 4C:
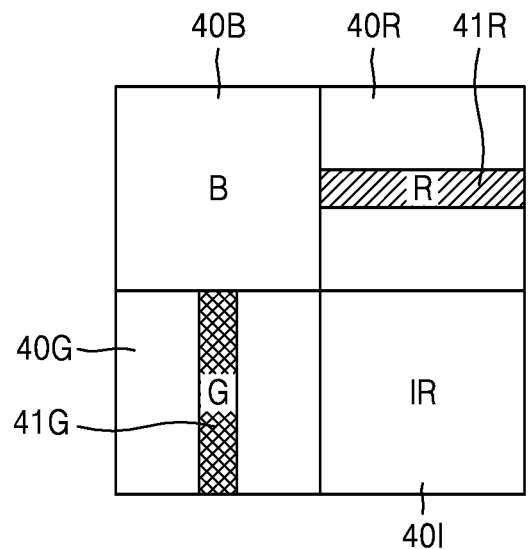

Referring to FIG. 4C, the infrared ray pixel 40I is arranged to directly contact the red pixel 40R and the green pixel 40G, and the blue pixel 40B is disposed in a diagonal direction of the infrared ray pixel 40I on a plain view of the image sensor according to the current exemplary embodiment while being in contact with the red pixel 40R and the green pixel 40G. The beam splitters 41G and 41B respectively are disposed in the green pixel 40G and the blue pixel 40B which are adjacent to the infrared ray pixel 40I, and thus, the optical efficiency of the infrared ray pixel 40I may be increased.

Figure 4D:
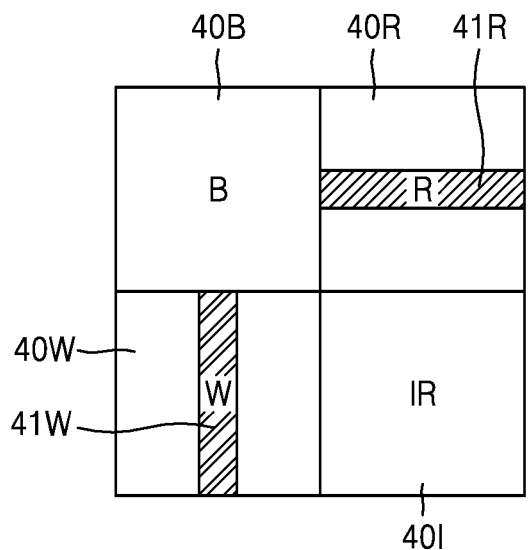

Referring to FIG. 4D, the infrared ray pixel 40I is arranged to directly contact the red pixel 40R and a white pixel 40W, and the blue pixel 40B is disposed in a diagonal direction of the infrared ray pixel 40I on a plain view of the image sensor while being in contact with the red pixel 40R and the white pixel 40W. The beam splitter 41R and a beam splitter 41W respectively are disposed in the red pixel 40R and the white pixel 40W which are adjacent to the infrared ray pixel 40I, and thus, the optical efficiency of the infrared ray pixel 40I may be increased.

Figure 4E:
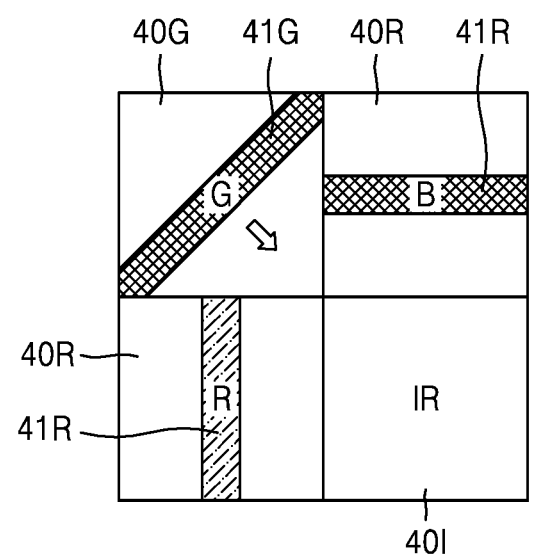

Referring to FIG. 4E, the infrared ray pixel 40I is arranged to directly contact the red pixel 40R and the blue pixel 40B, and the green pixel 40G is disposed in a diagonal direction of the infrared ray pixel 40I on a plain view of the image sensor according to the current exemplary embodiment while being in contact with the red pixel 40R the blue pixel 40B. The beam splitters 41R and 41B respectively are disposed in the red pixel 40R and the blue pixel 40B which are adjacent to the infrared ray pixel 40I, and thus, the optical efficiency of the infrared ray pixel 40I may be increased. Also, the beam splitter 41G that may refract an infrared ray component of light towards the infrared ray pixel 40I is disposed in the green pixel 40G that contacts the infrared ray pixel 40I and locates in a diagonal direction of the infrared ray pixel 40I, and thus, the optical efficiency of the infrared ray pixel 40I may be increased.

In the case of the image sensor according to the current exemplary embodiment, as depicted in FIG. 3, the beam splitters 20B and 20G may be respectively disposed in the pixel regions 20B and 20G adjacent to an infrared ray pixel 20I in horizontal and vertical directions to the infrared ray pixel 20I. Also, as depicted in FIG. 4E, the optical efficiency of the infrared ray pixel 40I may be increased by forming the beam splitter 41G in the red pixel 40R adjacent to the infrared ray pixel 40I in a diagonal direction.

Figure 5:
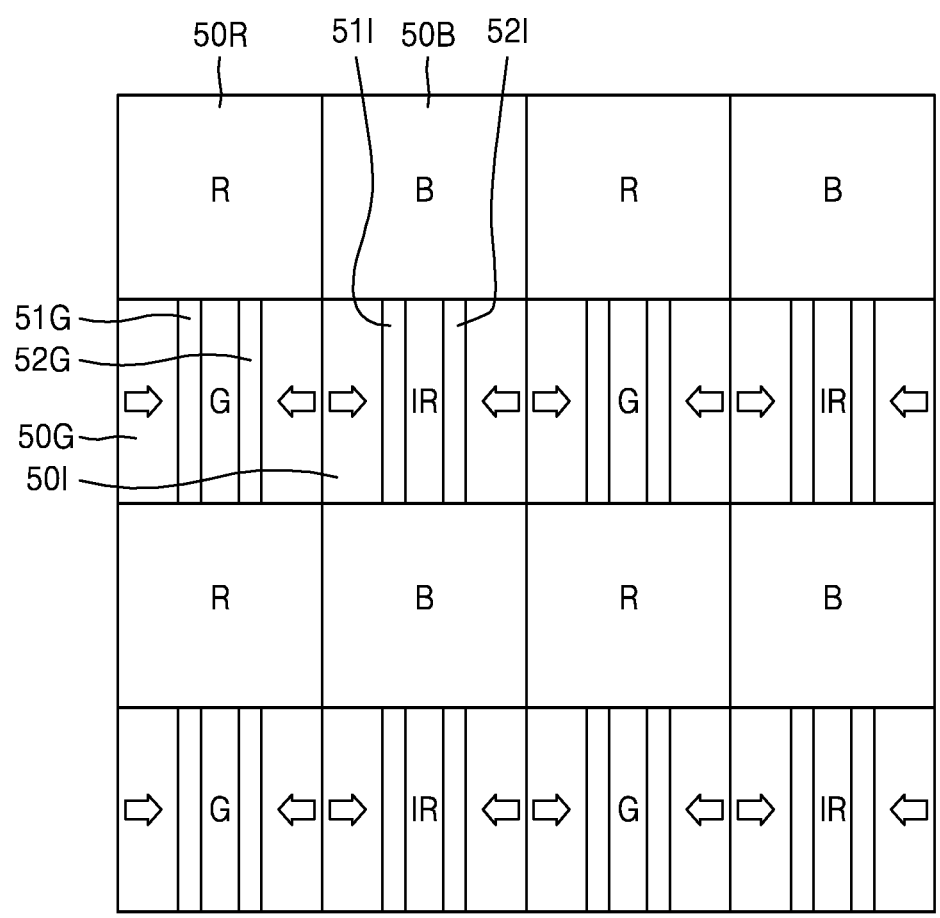
FIG. 5 is a schematic plan view of an image sensor having two beam splitters in a single pixel, according to an exemplary embodiment.

FIG. 5 is a schematic plan view of an image sensor having two beam splitters in a single pixel, according to an exemplary embodiment.

Referring to FIG. 5, an infrared ray pixel 50I is arranged to directly contact a green pixel 50G and a blue pixel 50B, and a red pixel 50R is arranged in a diagonal direction of the infrared ray pixel 50I while being disposed adjacently to the green pixel 50G and the blue pixel 50B. A first beam splitter 51G and a second beam splitter 52G may be disposed in the green pixel 50G that is directly adjacent to the infrared ray pixel 50I. The number of beam splitters 51G and 52G disposed in the green pixel 50G that is directly adjacent to the infrared ray pixel 50I may be selected based on a size and a width of the green pixel 50G. Also, a plurality of beam splitters 51I and 52I may be disposed in the infrared ray pixel 50I, and a three color beam splitter 51I and a four color beam splitter 52I may be disposed in the infrared ray pixel 50I.

Figure 6:
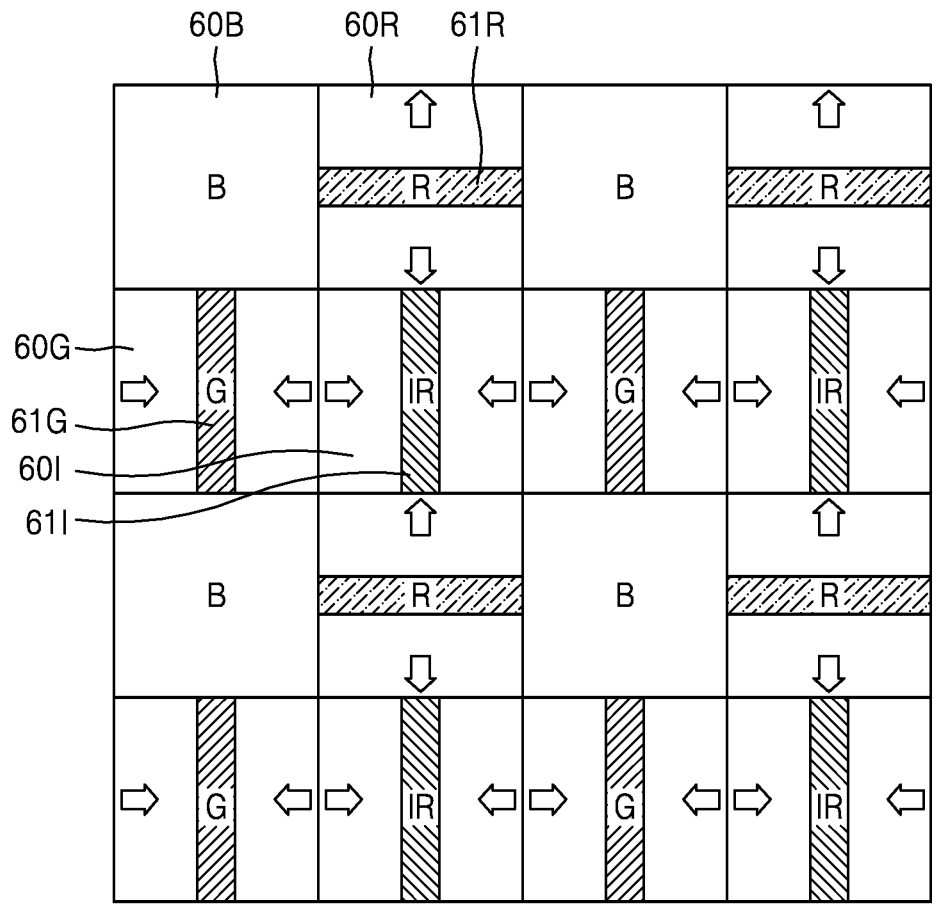
FIG. 6 is a schematic plan view of a pixel arrangement of an image sensor according to another exemplary embodiment.

FIG. 6 is a schematic plan view of a pixel arrangement of an image sensor according to another exemplary embodiment.

Referring to FIG. 6, an infrared ray pixel 60I is arranged to directly contact a red pixel 60R and a green pixel 60G, and a blue pixel 60B is arranged in a diagonal direction of the infrared ray pixel 60I while being disposed adjacently to the red pixel 60R and the green pixel 60G. Beam splitter 61R and 61G may be respectively disposed in the red pixel 60R and the green pixel 60G. The beam splitters 61R and 61G may change a travelling direction of light that enters the red pixel 60R and the green pixel 60G with a wavelength range of infrared ray region towards the infrared ray pixel 60I. Also, a beam splitter 61I that makes a travelling direction of light having a wavelength range of green component to change towards the infrared ray pixel 60I may be selectively disposed in the infrared ray pixel 60I.

The structures described above may provide an effect of maximizing the intensity of light incident to an infrared ray band in the region of the infrared ray pixel 60I since the travelling direction of an infrared ray component of components of light incident to the red pixel 60R and the green pixel 60G adjacent to the infrared ray pixel 60I is changed by the beam splitters 61R and 61G. Also, in the structure described above, the travelling direction of a green wavelength component of light incident to the infrared ray pixel 60I is changed towards the green pixel 60G, and thus, the optical effect of the image sensor is increased.

Figure 7:
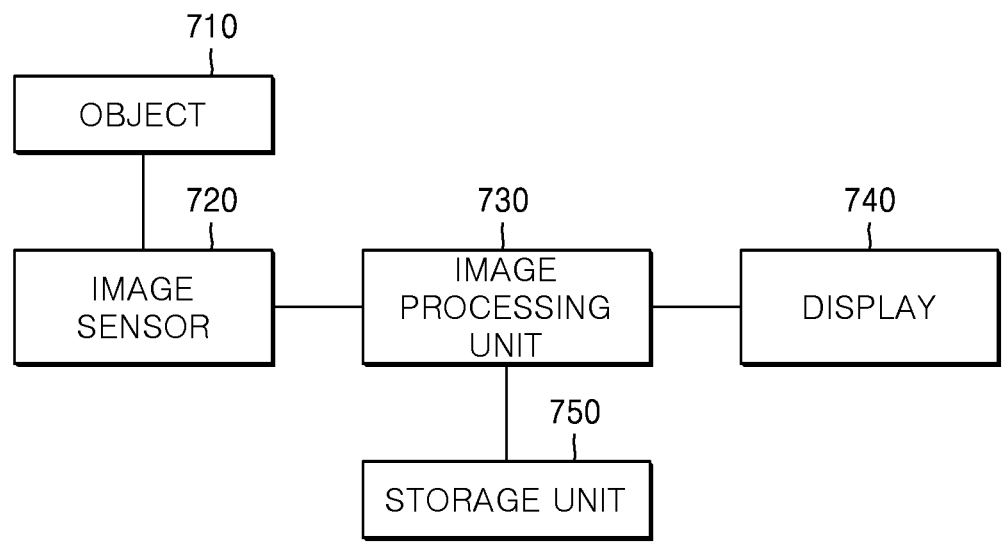
FIG. 7 is a block diagram of an image photographing apparatus including an image sensor according to an exemplary embodiment.

FIG. 7 is a block diagram of an image photographing apparatus including an image sensor 720 according to an exemplary embodiment.

Referring to FIG. 7, the image sensor 720 may be a part of a three-dimensional (3D) depth sensor. When an infrared ray or a far-infrared ray is irradiated to an object 710, the infrared ray or a far-infrared ray is reflected at a surface of the object 710 and enters the image sensor 720 locating on a travelling direction of a reflected light.

The reflected light entered the image sensor 720 may be an infrared ray or a far-infrared ray. According to the current exemplary embodiment, light of an infrared ray component that enters pixels that surround an infrared ray pixel and directly contact an infrared ray pixel may travel towards the infrared ray pixel by beam splitters disposed in the pixels adjacent to the infrared pixel. Accordingly, the intensity of infrared ray component detected by the beam splitters disposed in the surrounding pixels may be increased, and thus, the optical efficiency of the image sensor may be increased. The infrared ray component detected by the image sensor 720 is transformed to an electrical signal, and the electrical signal is processed in an image processing unit (e.g., an image processor) 730, and thus, depth information, that is, distance information of the object 710 may be obtained. The obtained distance information of the object 710 may be displayed on a display 740 and may be stored in a storage unit (e.g., a storage or a memory) 750.

The image sensor according to the current exemplary embodiment may increase the intensity of an infrared ray in an infrared ray pixel by changing a travelling direction of light of an infrared ray component incident to color pixels that directly contact the infrared ray pixel towards the infrared ray pixel. Also, a beam splitter may be disposed in the infrared ray pixel to change a travelling direction of light having a color wavelength corresponding to that of the color pixels adjacent to the infrared ray pixel, and thus, an overall optical efficiency of the image sensor may be increased.

The foregoing exemplary embodiments are merely exemplary and are not to be construed as limiting. The present teaching can be readily applied to other types of apparatuses. Also, the description of the exemplary embodiments is intended to be illustrative, and not to limit the scope of the claims, and many alternatives, modifications, and variations will be apparent to those skilled in the art.

What is claimed is:

1. An image sensor comprising:
   an optical detection device layer comprising a plurality of optical detection devices;
   a filter array layer comprising a plurality of color filters and at least one infrared filter, and disposed on the optical detection device layer; and
   a plurality of beam splitters that are disposed in a plurality of pixels, the plurality of pixels being in contact with an infrared ray pixel comprising the at least one infrared ray filter, and that are configured to change a direction of an infrared ray component of incident light towards the infrared ray pixel,
   wherein the plurality of pixels and the infrared ray pixel are alternately arranged, and the plurality of beam splitters are arranged to surround the infrared ray pixel.

2. The image sensor of claim 1, wherein the plurality of pixels adjacent to the infrared ray pixel are in contact with the infrared ray pixel in a horizontal direction and a vertical direction on a plain view of the image sensor.

3. The image sensor of claim 2, wherein the plurality of beam splitters make the infrared ray component of the incident light that enters all of the plurality of pixels in contact with the infrared ray pixel travel towards the infrared ray pixel.

4. The image sensor of claim 1, wherein the plurality of pixels are in contact with the infrared ray pixel in a diagonal direction of the infrared ray pixel on a plain view of the image sensor.

5. The image sensor of claim 4, wherein the plurality of pixels in contact with the infrared ray pixel in the diagonal direction comprise the plurality of beam splitters that make the infrared ray component of the incident light that enters all of the plurality of pixels in contact with the infrared ray pixel travel towards the infrared ray pixel.

6. The image sensor of claim 1, wherein each of the plurality of pixels comprises at least one of the plurality of beam splitters.

7. The image sensor of claim 1, further comprising a spacer layer disposed on the filter array layer,
   wherein the plurality of beam splitters are disposed on the spacer layer.

8. The image sensor of claim 7, wherein the plurality of beam splitters are buried in the spacer layer.

9. The image sensor of claim 1, wherein the infrared ray pixel comprises at least one beam splitter that changes a travelling direction of light incident onto the infrared ray pixel.

10. The image sensor of claim 1, wherein the optical detection device layer is disposed on a substrate, and the image sensor further comprises barrier ribs that separate each of the plurality of optical detection devices.

11. The image sensor of claim 1, wherein the plurality of pixels comprise a first pixel comprising a color filter and a second pixel comprising an infrared filter,
    wherein the first and second pixels are repeatedly arranged in a direction while being in contact with each other, and
    wherein the second pixel is the infrared ray pixel and the first pixel comprises the beam splitter for the second pixel.

* * * * *